(12) United States Patent
Choi

(10) Patent No.: US 12,431,378 B2
(45) Date of Patent: Sep. 30, 2025

(54) CHIP CHUCK AND A METHOD OF USING THE SAME

(71) Applicant: CANON KABUSHIKI KAISHA, Tokyo (JP)

(72) Inventor: Byung-Jin Choi, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 507 days.

(21) Appl. No.: 18/053,410

(22) Filed: Nov. 8, 2022

(65) Prior Publication Data

US 2024/0153808 A1 May 9, 2024

(51) Int. Cl.
*H01L 21/683* (2006.01)
*H01L 21/67* (2006.01)
*H01L 21/68* (2006.01)

(52) U.S. Cl.
CPC .... *H01L 21/6833* (2013.01); *H01L 21/67259* (2013.01); *H01L 21/68* (2013.01); *H01L 21/681* (2013.01)

(58) Field of Classification Search
CPC . H01L 21/68; H01L 21/681; H01L 21/67259; H01L 21/6833
See application file for complete search history.

(56) References Cited

U.S. PATENT DOCUMENTS

| 4,607,525 | A | 8/1986 | Turner et al. |
| 7,005,319 | B1 | 2/2006 | Chen et al. |
| 8,244,399 | B2 * | 8/2012 | Maeda ................... H01L 21/68 |
| | | | 414/217 |
| 9,105,675 | B2 | 8/2015 | Okamoto |
| 9,881,896 | B2 | 1/2018 | Lin et al. |
| 2010/0282956 | A1 * | 11/2010 | Kimba ................... G01N 23/00 |
| | | | 250/252.1 |
| 2018/0358508 | A1 | 12/2018 | Liao |
| 2020/0075360 | A1 | 3/2020 | Kim et al. |
| 2021/0057258 | A1 | 2/2021 | Kwag et al. |
| 2021/0091032 | A1 | 3/2021 | Bonem et al. |
| 2023/0245996 | A1 | 8/2023 | Sreenivasan |

FOREIGN PATENT DOCUMENTS

| WO | 2022212260 A1 | 10/2022 |
| WO | 2023056068 A1 | 4/2023 |
| WO | 2023056072 A1 | 4/2023 |

OTHER PUBLICATIONS

Von Trapp, Francoise, "Hybrid Bonding: From Concept to Commercialization," 3D InCites, 2018, pp. 1 to 13.

* cited by examiner

*Primary Examiner* — David A Zarneke
(74) *Attorney, Agent, or Firm* — Abel Schillinger, LLP

(57) ABSTRACT

An apparatus can include a chip transfer module that includes a chip chuck. The chip chuck can include a chucking surface that is configured to hold a chip. The chip chuck can further include a gap sensor that is configured to measure a distance between a sensor surface of the gap sensor and a surface spaced apart from the chip chuck. In an implementation, the surface can be an upper surface of a chip, a surface of a substrate, or a surface of a film or layer overlying the substrate. A method can be used to transfer a chip from a source substrate to a destination substrate, so that upper surfaces of chips on the destination substrate are co-planar or nearly co-planar.

13 Claims, 12 Drawing Sheets

CHIP CHUCK AND A METHOD OF USING THE SAME

FIELD OF THE DISCLOSURE

The present disclosure relates to chip chucks and methods of using the chip chucks.

RELATED ART

During a packaging operation, chips on a temporary substrate may need to be physically coupled to a different substrate. The different substrate can be an interposer with wirings or can include circuit elements. The chips on the temporary substrate may have different thicknesses. For example, the chips on the temporary substrate may be different types of chips, such as a memory chip and a microprocessor. Alternatively, the chips on the temporary substrate may be substantially identical electrical circuits but the chips may be from different production lots that were thinned at different times, on different tools, or using different processes. Other reasons for the thickness difference may occur. New packaging technologies will need equipment to address chips having different thicknesses using a process having sufficient process margin.

SUMMARY

In an implementation, a chip chuck can include a chucking surface configured to hold a first chip and have a corresponding chucking plane; and a first gap sensor configured to measure a distance between the first gap sensor and a surface spaced apart from the chip chuck.

In an embodiment, the first gap sensor includes a confocal sensor, a capacitive sensor, or an air gauge sensor.

In another embodiment, a sensor surface of the first gap sensor is within 5° of being co-planar with the chucking plane of the chip chuck.

In a further embodiment, the chucking surface has a first side that is disposed between the first gap sensor and a center of the chucking surface.

In a particular embodiment the chip chuck includes a set of gap sensors, including the first gap sensor, and the first side of the chucking surface is disposed between the set of gap sensors and a center of the chucking surface.

In another particular embodiment, the chip chuck further includes a second gap sensor, wherein the chucking surface has a second side opposite the first side, and the second side of the chucking surface is disposed between the second gap sensor and the center of the chucking surface.

In another embodiment, a system can include the chip chuck of claim 1. The system can further include a substrate chuck configured to hold a substrate, wherein a second chip is coupled to the substrate, wherein the second chip has a proximal surface and a distal surface opposite the distal surface, wherein the substrate is closer to the proximal surface than to the distal surface, and the first gap sensor is configured to measure the distance between the first gap sensor and the distal surface of the second chip. The system can further include a positioning system configured to control the position of the chip chuck relative to the substrate chuck in response to information supplied by the first gap sensor.

In another implementation, a method can include holding a first chip using a chip chuck, wherein the chip chuck includes a chucking surface configured to hold the first chip, and a first gap sensor. The method can also include holding a substrate on a substrate chuck, wherein a second chip is coupled to the substrate and has a proximal surface and a distal surface opposite the proximal surface, and the substrate is closer to the proximal surface of the second chip than to the distal surface of the second chip. The method can further include measuring a distance between the first gap sensor and the distal surface of the second chip; and controlling a position of the first chip relative to the substrate using the distance between the chucking surface of the chip chuck and the distal surface of the second chip.

In an embodiment, measuring the distance includes measuring a force supplied by an actuator that changes the distance between the chucking plane of the chip chuck and the distal surface of the second chip.

In another embodiment, the method further includes depositing a compensation film onto the substrate at a targeted location before decreasing a distance between the first chip and the substrate. During controlling the position of the first chip, a surface of the first chip contacts a portion of the compensation film that is disposed between the first chip and the targeted location of the substrate. The method further includes changing a state of the portion of the compensation film that is disposed between the substrate and the first chip.

In a particular embodiment, the method further includes depositing a bonding film onto the substrate at a desired location; bringing the second chip in contact with the bonding film, such that a portion of the bonding film is disposed between the second chip and the desired location of the substrate; and changing a state of the portion of the bonding film that is disposed between the substrate and the second chip.

In a more particular embodiment, depositing a bonding film, bringing the second chip in contact with the bonding film, and changing the state of the portion bonding film are performed before the first chip contacts the portion of the compensation film.

In another more particular embodiment, changing the state of the portion of the bonding film is performed by selectively curing the bonding film.

In an even more particular embodiment, the compensation film and the bonding film have a same composition.

In another particular embodiment, the method further includes bonding the first chip and the second chip to a destination substrate; removing the destination substrate from the first chip and the second chip; removing the compensation film from the first chip; and annealing the destination substrate, the first chip, and the second chip after removing the destination substrate and removing the compensation film.

In another particular embodiment, the first chip has a device side and a back side opposite the device side, wherein a majority of circuit elements within the first chip are along the device side, and the device side of the first chip contacts the chip chuck during a portion of the method.

In a further particular embodiment, the first chip has a device side and a back side opposite the device side, wherein a majority of circuit elements within the first chip are along the device side, and the back side of the second chip contacts the chip chuck during a portion of the method.

In another embodiment, a third chip is coupled to the substrate and has a proximal surface and a distal surface opposite the proximal surface, and the substrate is closer to the proximal surface of the third chip than to the distal surface of the third chip, an average elevation of the distal surface of the second chip lies at a different elevation as compared to an average elevation of the distal surface of the third chip, a gap is disposed between the second chip and the third chip. Controlling the position of the first chip further includes placing the first chip within the gap between the second chip and the third chip; and terminating movement of the first chip after the chip chuck is within a predetermined distance between the chip chuck and each of the second chip and the third chip.

In a particular embodiment, the method further includes depositing a compensation film onto the substrate before controlling the position of the first chip; during controlling the position of the first chip, a surface of the first chip contacts a portion of the compensation film; and changing a state of the portion compensation film that is disposed between the substrate and the first chip.

In another particular embodiment, the predetermined distance is 0 nm.

BRIEF DESCRIPTION OF THE DRAWINGS

Implementations are illustrated by way of example and are not limited in the accompanying figures.

Skilled artisans appreciate that elements in the figures are illustrated for simplicity and clarity and have not necessarily been drawn to scale. For example, the dimensions of some of the elements in the figures can be exaggerated relative to other elements to help improve understanding of implementations of the invention.

DETAILED DESCRIPTION

The following description in combination with the figures is provided to assist in understanding the teachings disclosed herein. The following discussion will focus on specific implementations and implementations of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and can be found in textbooks and other sources within the relevant arts.

Figure 1:
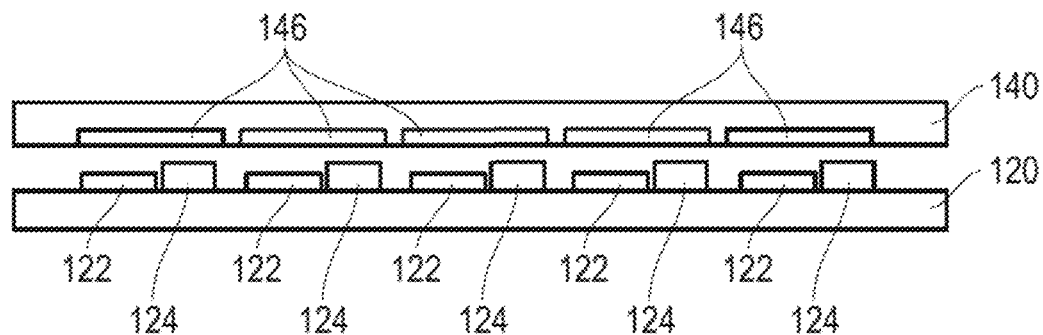
FIG. 1 includes a cross-sectional view of a substrate with chips coupled to the substrate and another substrate with circuit elements.

The difference in thicknesses between the chips may cause difficulties during a transfer operation, and the difficulties can be better understood with respect to FIG. 1. FIG. 1 includes a cross-sectional view of a temporary substrate 120 that is coupled to chips 122 and chips 124. Each of the chips 122 and 124 has a proximal surface closer to the temporary substrate and a distal surface farther from the temporary substrate. The chips 122 have the same thickness as compared to one another, and chips 124 have the same thickness compared to one another. However, the chips 122 have different thicknesses as compared to the chips 124. In FIG. 1, the chips 124 are thicker than the chips 122. The different substrate 140 includes circuit elements 146 that are to be physically and electrically connected to the chips 122 and 124. As the temporary substrate 120 and the different substrate 140 get closer to each other, the distal surfaces of the chips 124 will contact the circuit elements 146 in the different substrate 140 before the chips 122. The chips 122 may not be able to connect properly to the circuit elements in the different substrate 140. If the substrates 120 and 140 are continued to be moved closer to each other, a significant risk of damaging the chips 124, the corresponding circuit elements 146 on the different substrate 140, the substrate 120, or the substrate 140 can occur.

The foregoing issues described with respect to FIG. 1 can be overcome or at least lessened with a new design for an apparatus and method of using the apparatus. The apparatus can include a chip transfer module that includes a chip chuck. The chip chuck can include a chucking surface. The chucking surface is configured to hold a chip and has a corresponding chucking plane. The chip chuck can further include a gap sensor that is configured to measure a distance between a sensor surface of the first gap sensor and a surface spaced apart from the chip chuck. In an embodiment, a chip overlying to a source substrate can be removed using the chip chuck and transferred to a destination substrate that already has another chip and a compensation film overlying the destination substrate. As the chip chuck approaches the other chip coupled to the destination substrate, one or more gap sensors in the chip chuck can measure a distance to a distal surface of the other chip. The chip chuck can position the chip (from the source substrate) over a targeted location of the destination substrate, such that the upper surfaces of the chips are co-planar or have their upper surfaces at average elevations that are within a desired tolerance.

In another implementation, two chips can overlie the destination substrate and be separated by a gap. The chips may have distal surfaces that lie at different elevations above the destination substrate. Another chip can be placed within the gap. In this implementation, the chip chuck can contact the chips. The placement of the chips over the destination substrate allows for a more gradual change in elevation along the distal surfaces of the chips.

The apparatus, including the chip chuck, and corresponding methods can help to reduce damage to chips, sets of circuit elements, and substrates as the chips are transferred to another substrate. The co-planarity or relatively small elevational difference of the distal surfaces of the chips is well suited for hybrid bonding and flip-chip bonding. Thus, the apparatus and corresponding methods can allow a set of chips to be transferred between substrates during a same transfer operation with less risk of damage. After reading this specification, skilled artisans will appreciate that many implementations are described, and an implementation can be tailored for a particular application.

Figure 2:
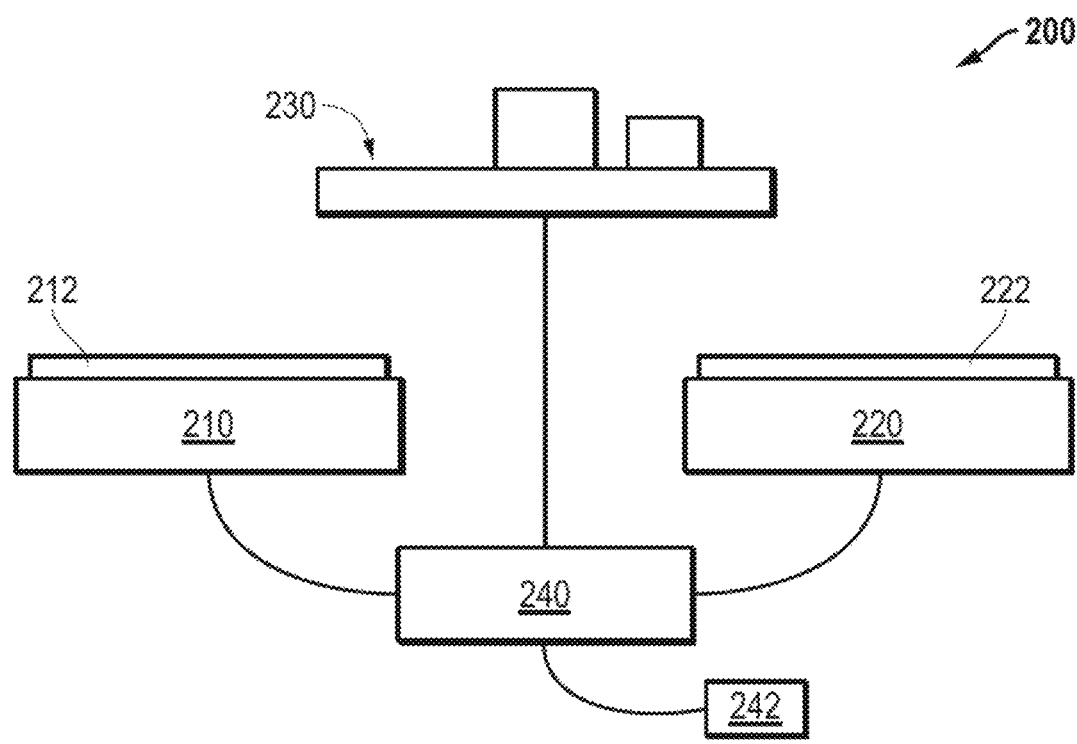
FIG. 2 includes an illustration of a conceptual view of an apparatus including a chip transfer module in accordance with an embodiment.

FIG. 2 includes a schematic diagram of an apparatus 200 that can be used to transfer chips from a source substrate 212 to a destination substrate 222. The terms "source" and "destination" are relative to each other. For example, the source substrate may be an initial substrate or a transfer substrate. Likewise, the destination substrate may be a transfer substrate or a final substrate. The source substrate 212 can hold chips that are to be transferred to the destination substrate 222. The source substrate 212 can be an adhesive tape that may be in the form of a tape frame or tape reel, a container having a lattice that defines a matrix of regions that can hold a chip, or the like. The destination substrate 222 can include any of the substrates described with respect to the source substrate 212 and can also include a semiconductor wafer, a package substrate, a printed wiring board, a circuit board, an interposer, or the like. Microelectronic devices may be part of the destination substrate, such as a semiconductor wafer. For the package substrate, the printed wiring board, the circuit board, or the interposer a chip may be already mounted thereto. Chips from the source substrate 212 may can be mounted directly to the destination substrate 222 using the apparatus 200 in FIG. 2.

The source substrate 212 is coupled to a substrate chuck 210, and the destination substrate 222 is coupled to a substrate chuck 220. Each of the substrate chucks 210 and 220 can be a vacuum chuck, pin-type chuck, a groove-type chuck, an electrostatic chuck, an electromagnetic chuck, or the like. The substrate chucks 210 and 220 can be the same type or different types of chucks. Each of the substrate chucks 210 and 220 can be further supported by a stage (not illustrated. The stage can provide translating motion along the X-, Y-, or Z-directions or rotational motion about one or more of axes, such as rotation about a Z-axis and along a plane lying along X- and Y-directions.

The substrate chuck 210, the substrate chuck 220, or each of substrate chucks 210 and 220 may be heated or cooled. In an embodiment, a heater can be used to heat the substrate chuck. In the same or different embodiment, a fluid may flow through the substrate chuck to cool or heat the substrate chuck.

The apparatus 200 includes a chip transfer module 230 that is described in more detail later in this specification.

The apparatus 200 can be controlled by a controller 240 in communication with the substrate chuck 210, the substrate chuck 220, a corresponding stage, the chip transfer module 230, or any combination thereof and can operate on a computer readable program, optionally stored in a non-transitory computer readable medium 242, such as a hard disk or a memory device. The controller 240 can include a processor (for example, a central processing unit of a microprocessor or microcontroller), a field-programmable gate array (FPGA), an application specific integrated circuit (ASIC), or the like. The controller 240 can be within the apparatus 200. In another implementation (not illustrated), the controller 240 can be at least part of a computer external to the apparatus 200, where such computer is bidirectionally coupled to the apparatus 200.

The apparatus 200 may include more than one substrate chuck that includes another source substrate or another destination substrate, more stages, more than one chip transfer module 230, or any combination thereof.

Figure 3:
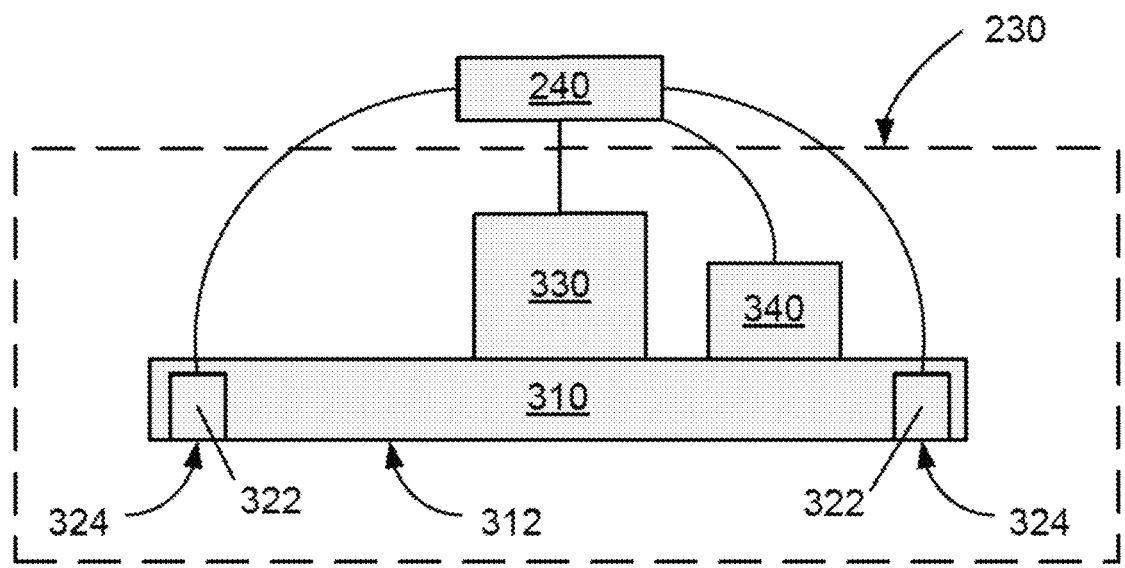
FIG. 3 includes an illustration of a conceptual view of the chip transfer module and its couplings to a processor of the apparatus.

FIG. 3 includes a schematic diagram of the chip transfer module 230 that is configured to move a chip from one location, for example, the source substrate 212, to another location, for example, the destination substrate 222. The chip transfer module 230 is illustrated as a box with dashed lines in FIG. 3.

The chip transfer module 230 includes a chip chuck 310, a positioning system 330, and a chip retention actuator 340. The controller 240 is electrically coupled to gap sensors 322, the positioning system 330, and the chip retention actuator 340. The electrical couplings may be unidirectional or bidirectional.

The chip chuck 310 has a chucking surface 312 that can lie along a chucking plane. The chucking plane can be used as a reference plane and is not required to be along the chucking surface 312. The chucking plane can be another surface of the chip chuck 310, where the other surface is along the same side of the chip chuck as the chucking surface 312.

The gap sensors 322 have sensor surfaces 324 and are disposed within the chip chuck 310. One or both of the sensor surfaces 324 can be substantially co-planar with the chucking plane of the chip chuck 310, such as, within 5° of being co-planar with the chucking plane. The chucking plane may be offset in the Z-axis, such that the chucking plane is at an elevation that is within 9 microns of one or both of the sensor surfaces 324. The height of the gap sensors' surfaces from the chucking surface does not need to be precise, and each sensor can be calibrated using a flat surface for its setup. Each of the gap sensors 322 is configured to measure a distance between the sensor surface 324; and a surface (not illustrated in FIG. 3) that is spaced apart from the chip chuck 310. Each of the gap sensors 322 can be a confocal sensor, a capacitive sensor, or an air gauge sensor.

The positioning system 330 can control motion along an X-axis, a Y-axis, and a Z-axis, where the axes are perpendicular to each other. In FIG. 3, the X-axis is in a horizontal direction between the left-hand and right-hand sides of the figure, the Y-axis in the horizontal direction into and out of the drawing sheet, and the Z-axis is in a vertical direction between the top and bottom of the figure. The positioning system 330 can also be configured to allow rotation along the Z-axis. The positioning system 330 can include an actuator that can control one or more motors, pneumatic valves, or the like to cause the chip chuck 310 to move in a desired direction. In an embodiment, the actuator can control electrical current provided to a motor or to open or close a pneumatic valve.

The chip retention actuator 340 can receive signals from the controller 240 to activate or deactivate a vacuum, an electrostatic charge, an electromagnetic field or to move pins, clips, or another mechanical retention into a retaining state or a release state with respect to the chip chuck 310.

The controller 240 can receive information to allow for the chip chuck 310 to obtain and position a chip to a desired or targeted location. The controller 240 can receive distance information from the gap sensors 322 and transmit signals to the positioning system 330 to control the position of the chip chuck 310. The controller 240 may also use other information, such as the thickness of the chip, where such information is used in moving the chip chuck 310 to the desired or targeted location. The controller 240 can also provide signals to activate or deactivate the chip retention actuator 340.

As illustrated in FIG. 3, the controller 240 is external to the chip transfer module 230. In another embodiment (not illustrated), the chip transfer module 230 can include its own local controller and may or may not have a local memory. The local controller can have any of the implementations as previously described with respect to the controller 240. The local controller and the controller 240 may be identical or different from each other. The controller 240 may or may not be electrically coupled to the local controller.

Figure 4:
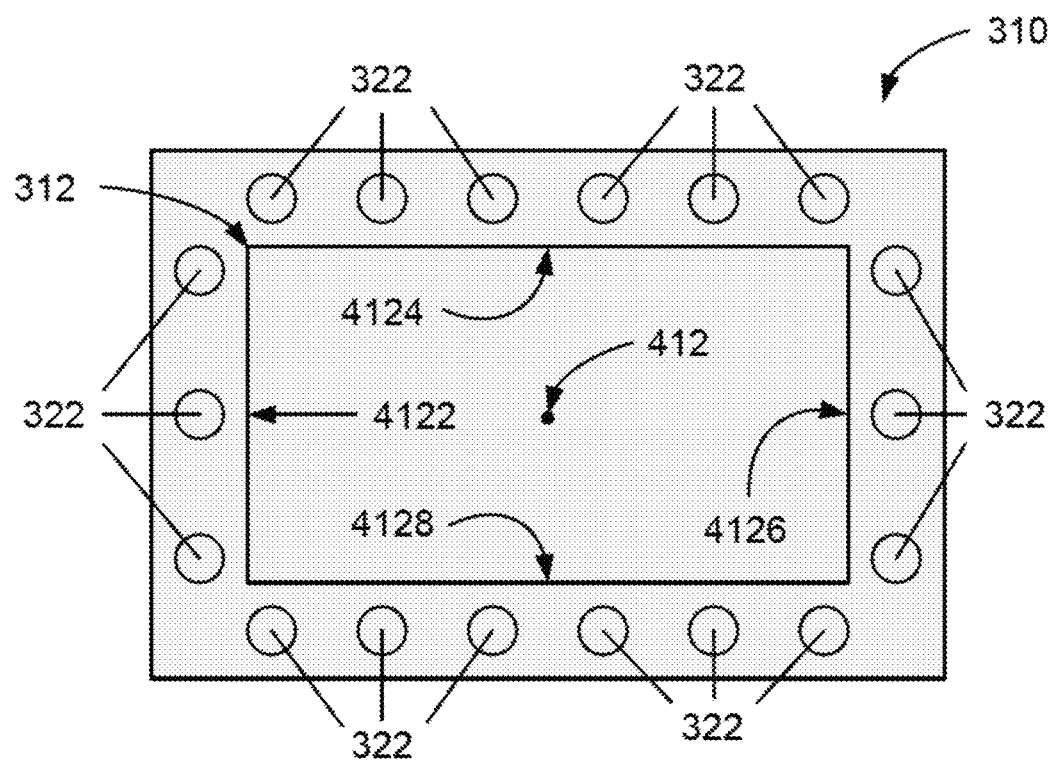
FIG. 4 includes an illustration of a bottom view of the chip chuck.

FIG. 4 includes a bottom view of the chip chuck 310. With respect to FIG. 3, such view would be under the chip chuck 310 looking upward. The chucking surface 312 has a center 412 and sides 4122, 4124, 4126, and 4128, where the side 4122 is opposite the side 4126, and the side 4124 is opposite the side 4128. The side 4122 is disposed between the center 412 and the three gap sensors 322 along the left-hand side of FIG. 4. The side 4124 is disposed between the center 412 and the six gap sensors 322 along the top of FIG. 4. The side 4126 is disposed between the center 412 and the three gap sensors 322 along the right-hand side of FIG. 4. The side 4128 is disposed between the center 412 and the six gap sensors 322 along the bottom of FIG. 4. Although not illustrated, an opening, a groove, a clip, or another component to may be present along the surface of the chip chuck 310 and coupled to the chip retention actuator 340 (in FIG. 3).

The number and location of gap sensors 322 as illustrated in FIG. 4 can be varied. The chip chuck 310 may have only one gap sensor 322 or may have only two gap sensors 322, where the sensors are along opposite sides of the chucking surface 312. Fewer gap sensors 322 may be along each of the sides 4124 and 4128. More gap sensors 322 may be used along any one or more of the sides 4122, 4124, 4126, and 4128. The gap sensors 322 may not be equally spaced along each of the sides 4122, 4124, 4126, and 4128. After reading this specification, skilled artisans will be able to determine the number and location of gap sensors 322 to be used with the chip chuck 310.

Attention is directed to methods of using the apparatus 200 to transfer chips on a source substrate to a destination substrate. The destination substrate can be a transfer substrate in the methods described below. The methods can be used to mount chips having different thicknesses to the transfer substrate where exposed surfaces of the chips coupled to the destination substrate lie closer to the same elevation. One of the methods can include using a compensation film to account for thickness differences between different chips. The methods are better understood with the details below in conjunction with the figures.

Figure 5:
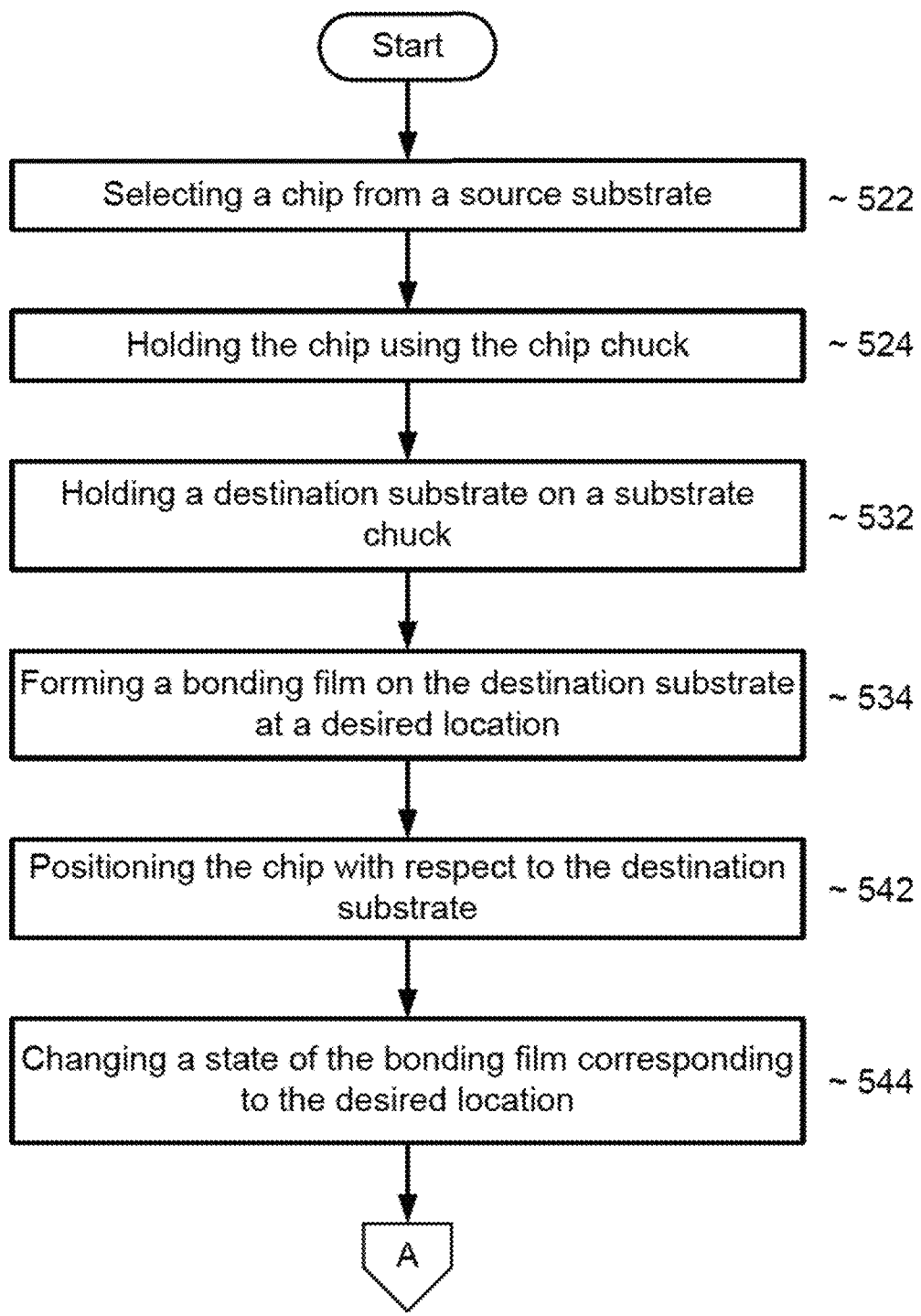
FIGS. 5 to 7 include a process flow diagram for a method transferring chips from one or more source substrates to a destination substrate and transferring the chips from the destination substrate to another substrate.
Figure 6:
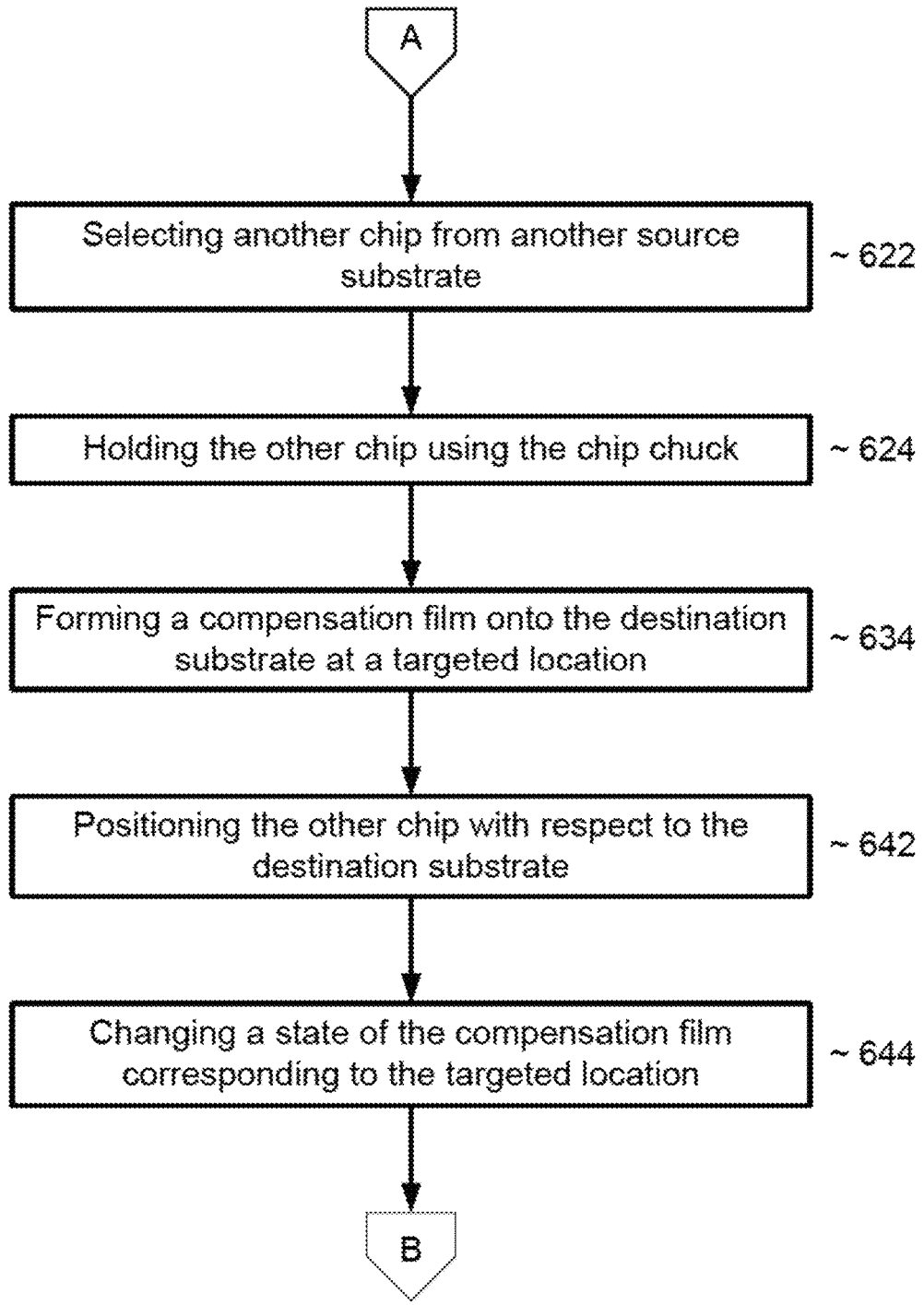
Figure 7:
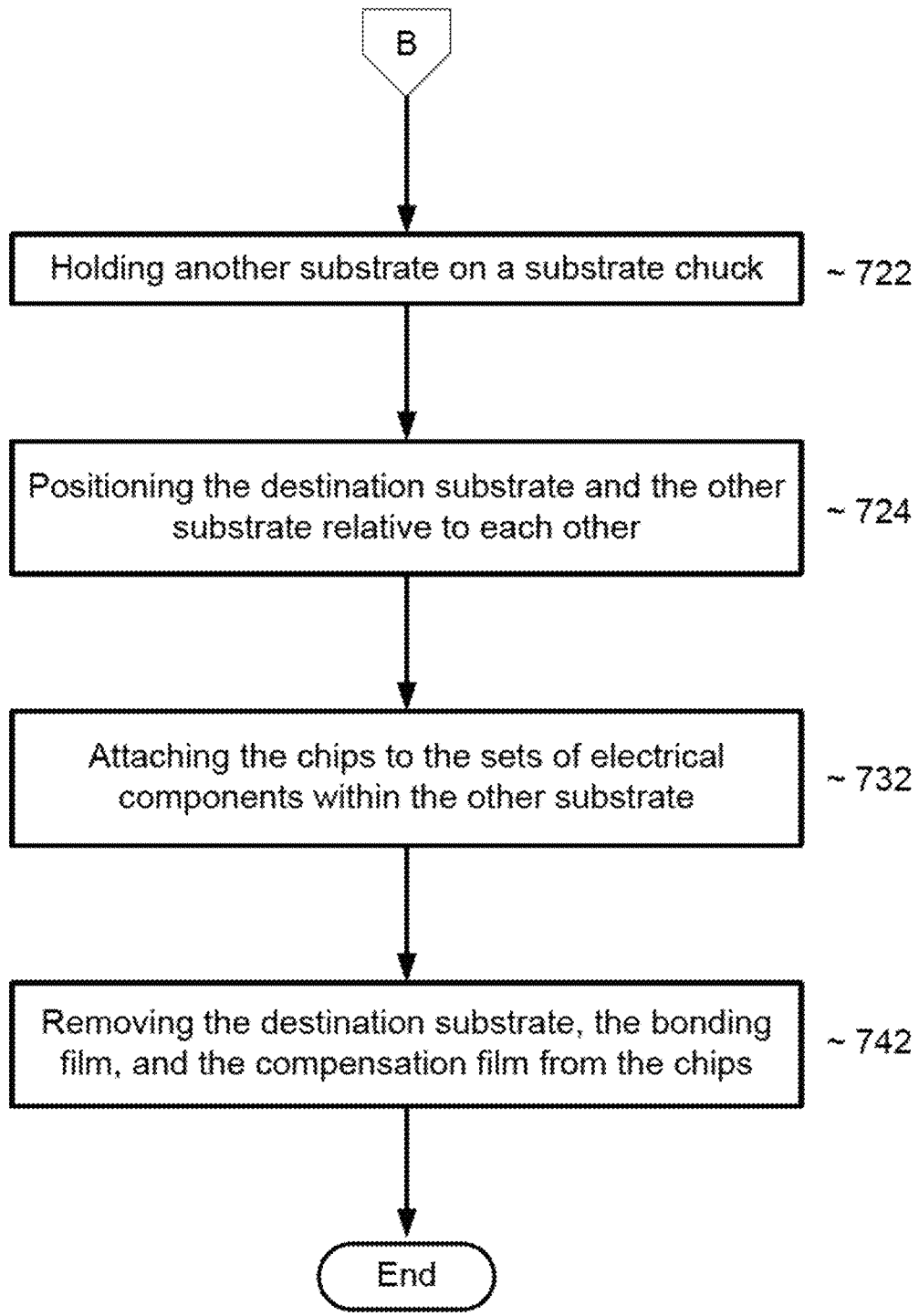
Figure 8:
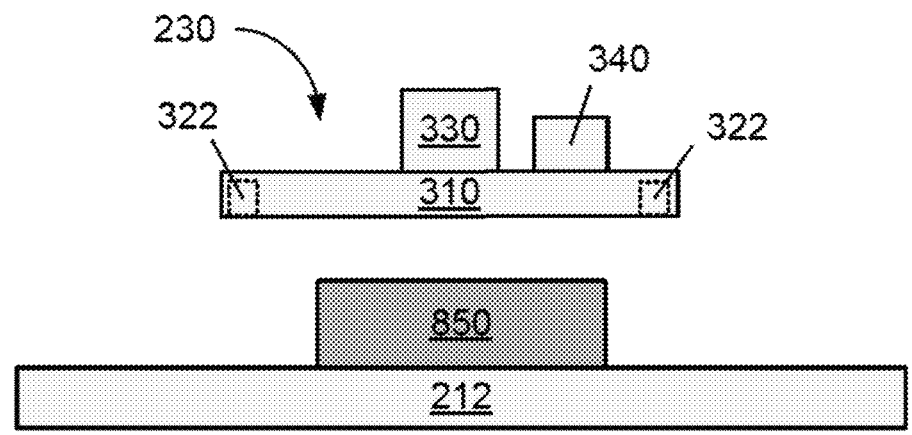
FIG. 8 includes an illustration of a cross-sectional view of a portion of a source substrate and a chip overlying the source substrate.

Some operations may be performed before the operations recited in the flow chart of FIGS. 5 to 7. The source substrate 212, the destination substrate 222, or both can be registered in their respective stage coordinates. After registration, the source substrate 212 can be loaded with chips that are placed in their proper locations. Referring to FIG. 8, the chip 850 can be registered in the substrate coordinates, and if needed or desired, the thicknesses of the chip 850 can be measured. The chip 850 may or may not have been thinned and has a thickness in a range from 4 microns to 800 microns or from 20 microns to 100 microns. Although FIG. 8 illustrates one chip 850, one or more chips identical to chip 850 can be present over the source substrate. The thicknesses of the chips may vary by a few microns, for example, less than 5 microns.

The process flow continues with the flow chart in FIGS. 5 to 7. The method includes selecting a chip from a source substrate at block 522 in FIG. 5. FIG. 8 includes a cross-sectional view of the chip transfer module 230, the source substrate 212, and the chip 850. The couplings of the positioning system 330 and the chip retention actuator 340 to the controller 240 (FIG. 3) are present but not illustrated in FIG. 8 and subsequent figures to simplify understanding the concepts described herein. In an embodiment, the source substrate 212 can include wafer dicing tape that is held in place by a retaining ring. A wafer including microelectronic devices can be placed on the wafer dicing tape, and the wafer can be singulated into chips, including the chip 850 as illustrated in FIG. 8.

The chip 850 has a proximal surface and a distal surface opposite the proximal surface, where the source substrate 212 is closer to the proximal surface than to the distal surface. The chip 850 can include a microprocessor, a microcontroller, a graphic processing unit, a digital signal processor, a memory chip (for example, a Level 2 or Level 3 cache, a flash memory, or the like), a power transistor chip, a power circuit chip, or the like. The chip 850 has a device side, which has most or all of the circuit elements of the chip 850, and a back side opposite the device side. In the embodiment as illustrated in FIG. 8, the device side is along distal surface of the chip 850, and in another embodiment, the device side of the chip 850 is along the proximal surface of the chip 850.

The process can further include holding the chip using the chip chuck at block 524 in FIG. 5. Referring to FIG. 8, the positioning system 330 causes the chip chuck 310 to contact the chip 850, and the chip retention actuator 340 is activated. The chip transfer module 230 provides sufficient force to remove the chip 850 from the source substrate 212. The chip 850 is no longer in contact with the source substrate 212 and able to be moved to a location spaced apart from the source substrate 212.

The process can include holding a destination substrate on a substrate chuck at block 532 and forming a bonding film onto the destination substrate at a desired location at block 534 in FIG. 5. Referring to FIG. 2, the destination substrate 222 is held in place by the substrate chuck 220. Radiation may be used to change a state of a subsequently-formed compensation film. If the radiation is to be transmitted through the destination substrate 222, the destination substrate 222 can have a transmittance of at least 70%, at least 80%, at least 85%, or at least 90% for radiation passing through the destination substrate 222.

Figure 9:
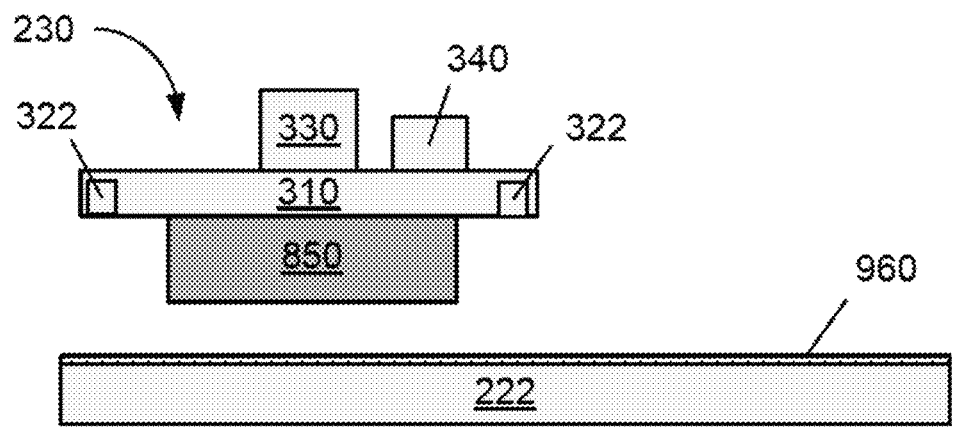
FIG. 9 includes an illustration of a cross-sectional view of the chip transfer module and the chip overlying and spaced apart from a bonding film that overlies a portion of a destination substrate.

A bonding film 960 can be formed over part of all of the surface of the destination substrate 222 as illustrated in FIG. 9. The bonding film 960 can include a type of adhesion material that can be applied either spin-on processes or jetting processes. In an embodiment, the bonding film 960 can be cured using actinic radiation in a range from 100 nm to 1000 nm.

In another embodiment, the bonding film 960 may be a solid. For example, the bonding film 960 may be a wax or a thermoplastic polymer. Such material can be a solid at room temperature and have a glass transition temperature that is less than the melting point of the material. For example, polymethylmethacrylate (PMMA) when not cross-linked is a thermoplastic polymer having a glass transition temperature of 105° C. and a melting point of 160° C. Thus, a force can be used to change the shape of the PMMA when the PMMA is at a temperature of at least 105° C.

The bonding film 960 can have a thickness in a range of 2 nm to 100 nm. The bonding film 960 can be thicker than the range above; however, increasing the thickness may complicate processing. After reading this specification, skilled artisans will be able to determine a thickness for the bonding film 960 that meets the needs or desires for a particular application.

Figure 10:
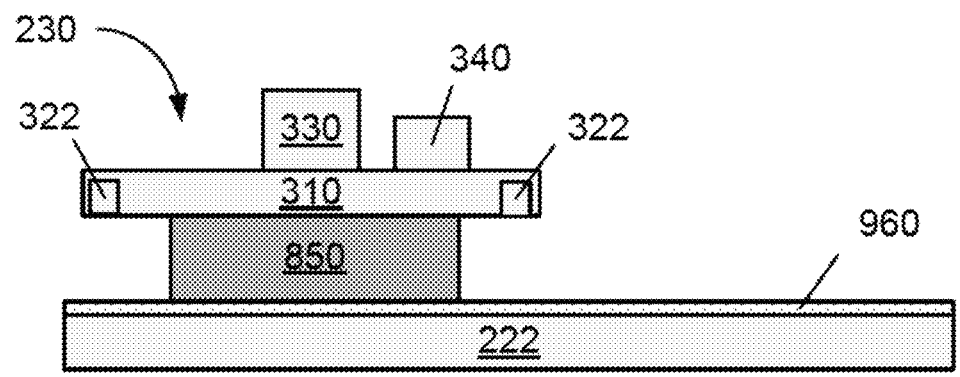
FIG. 10 includes an illustration of a cross-sectional view of the chip transfer module, the chip, the bonding film, and the destination substrate after the chip is positioned over a desired location of the destination substrate.

The process can further include positioning the chip with respect to the destination substrate at block 542 in FIG. 5. The chip chuck 310, the destination substrate 222 (in FIG. 2) or both can be moved so that the chip 850 is over a desired location of the destination substrate 222 as illustrated in FIG. 9 and then contacts the bonding film 960 as illustrated in FIG. 10. The positioning system 330 can be used to position the chip 850. The thickness of the chip 850, distances as measured by the gap sensors 322, elevation of the upper surface of the bonding film 960 or the destination substrate 222, or any combination thereof may be used in positioning the chip 850. After the chip 850 contacts the bonding film 960 over the desired location, the chip retention actuator 340 can be deactivated to release chip 850. The chip transfer module 230 can be moved away from the chip 850. Alternatively, the chip transfer module 230 may hold the chip 850 until the bonding film 960 changes state as described below.

Figure 11:
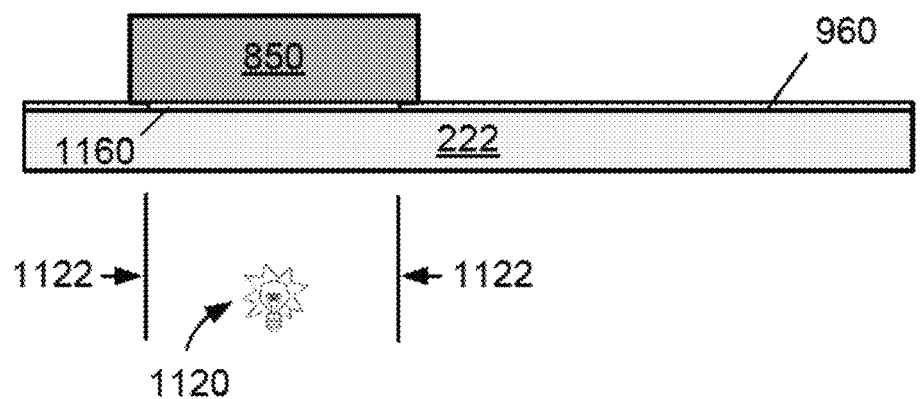
FIG. 11 includes an illustration of a cross-sectional view of the chip, the bonding film, the destination substrate, and a radiation source after at least a portion of the bonding film changed state.

The process further includes changing a state of the bonding film corresponding to the desired location at block 544 of FIG. 5. Changing the state includes many different changes that can occur to the bonding film 960, depending on the composition of the bonding film 960. The change can be a phase change, such as between a liquid or a gel to a solid, a solid to a liquid or a gel, changing temperature to cross a glass transition temperature, polymerization with or without cross linking, interaction with a solvent, a reaction with a chemical, or the like. Referring to FIG. 11, a radiation source 1120 emits radiation that is transmitted to change the bonding film 960 in one state to a bonding film 1160 in another state. The radiation from the radiation source 1120 may be restricted by a collimator 1122 or a mask (not illustrated) or the radiation source 1120 may emit a radiation over a relatively small area. Alternatively, the radiation may be a flood exposure where radiation reaches all or nearly all of the destination substrate 222. In the embodiment as illustrated, the material of the destination substrate 222 allows radiation to pass through the destination substrate 222 to reach the bonding film 960. In an embodiment, the bonding film 960 can include a precursor of a polymer and the bonding film 1160 can be the corresponding polymer. For example, the polymer can be an acrylate.

The bonding film 1160 may extend to the edges of the chip 850 or extend under only a portion of the chip 850 as illustrated in FIG. 11 or all of the chip. The area of the bonding film 1160 in contact with the destination substrate 222 and the chip 850 is sufficient to retain the chip 850 until a subsequent transfer operation is performed. The remaining portion of the bonding film 960 (the portion that did not have a change in state) may or may not be removed at this time. The bonding film 1160 remains disposed between the chip 850 and the destination substrate 222. The chip chuck 310 can release the chip 850 if the chip chuck 310 held the chip 850 when the bonding film 960 changed state to the bonding film 1160.

Figure 12:
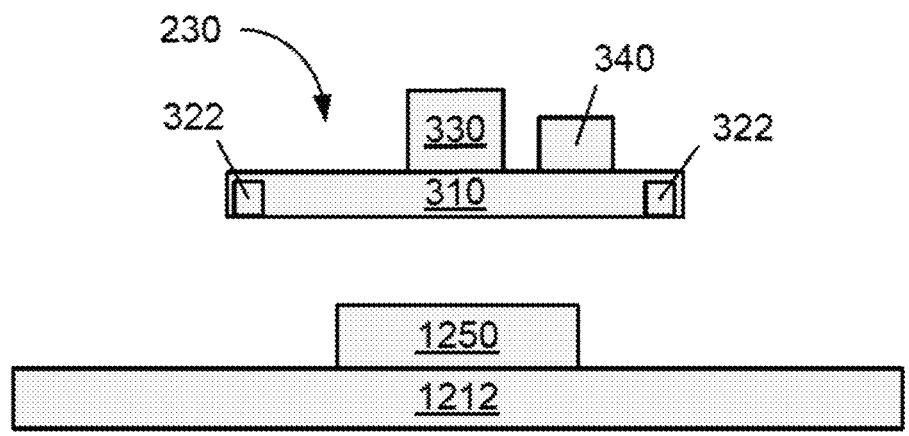
FIG. 12 includes an illustration of a cross-sectional view of the chip transfer module, another source substrate, and another chip overlying the other source substrate.

Another chip can be coupled to the destination substrate 222. Referring to FIG. 12, a chip 1250 can be registered in the substrate coordinates if this has not yet already occurred. If needed or desired, the thicknesses of the chips can be measured. The chip 1250 has a different thickness as compared to the chip 850. The thickness of the chip 1250 may be less than the thickness of the chip 850 or may be greater than the thickness of the chip 850. In the embodiment illustrated in FIG. 12, the chip 1250 is thinner than the chip 850. The chip 1250 may have been thinned and has a thickness in a range from 10 microns to 500 microns or from 20 microns to 90 microns. Although FIG. 12 illustrates one chip 1250, one or more chips identical to chip 1250 can be present over the source substrate. The thicknesses of the chips may vary by a few microns, for example, less than 5 microns.

The process further includes selecting another chip from another source substrate at block 622 in FIG. 6. FIG. 12 includes a cross-sectional view of the chip transfer module 230, another source substrate 1212, and the chip 1250. The source substrate 1212 can be any of the substrates as described with respect to the source substrate 212. In an embodiment, the source substrate 1212 can include wafer dicing tape that is held in place by a retaining ring. A wafer including microelectronic devices can be placed on the wafer dicing tape, and the wafer can be singulated into chips, including the chip 1250 as illustrated in FIG. 12. The chip 1250 can be of any of the types previously described with respect to the chip 850. The chip 1250 can be of the same type or a different type as compared to the chip 850. The chip 1250 may have the same circuits or different circuits as compared to the chip 850. More chips may be present over the source substrate 1212 but are not illustrated in FIG. 12.

The chip 1250 has a proximal surface and a distal surface opposite the proximal surface, where the source substrate 1212 is closer to the proximal surface than to the distal surface. The chip 1250 has a device side, which has most or all of the circuit elements of the chip 1250, and a back side opposite the device side. In the embodiment illustrated in FIG. 12, the device side is along distal surface of the chip 1250, and in another embodiment, the device side of the chip 1250 is along the proximal surface of the chip 1250.

The process can further include holding the other chip using the chip chuck at block 624 in FIG. 6. Referring to FIG. 12, the positioning system 330 causes the chip chuck 310 to contact the chip 1250, and the chip retention actuator 340 is activated. The chip transfer module 230 provides sufficient force to remove the chip 1250 from the source substrate 1212. The chip 1250 is no longer in contact with the source substrate 1212 and able to be moved to a location spaced apart from the source substrate 1212.

Figure 13:
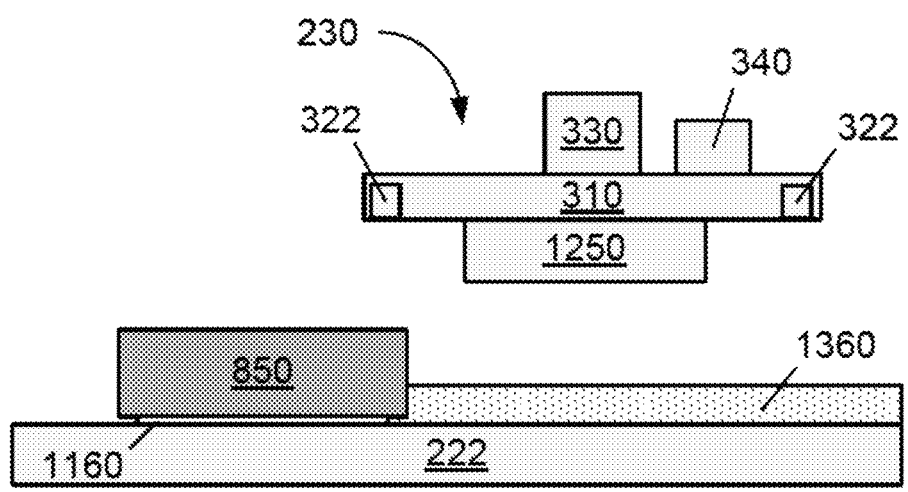
FIG. 13 includes an illustration of a cross-sectional view of the chip transfer module and the other chip overlying and spaced apart from a compensation film that overlies the destination substrate.

The process can include forming a compensation film onto the destination substrate at a targeted location at block 634 in FIG. 6. The targeted area corresponds to the area over which the chip 1250 will be positioned as illustrated in FIG. 13. A compensation film 1360 can be deposited over part of all of the exposed surface of the destination substrate 222. The compensation film 1360 can include any of the materials previously described with respect to the bonding film 960. The compensation film 1360 can have the same composition or different composition as compared to the bonding film 960. The compensation film 1360 can deposited using any of the techniques previously described with respect to the bonding film 960. The compensation film 1360 can be deposited using the same deposition technique or different deposition technique as compared to the bonding film 960. The compensation film 1360 can be deposited as a liquid or a gel (for example, a semi-solid colloid of a solid and a liquid). In another embodiment, the compensation film 1360 may be a solid. For example, the compensation film 1360 may be a wax or a thermoplastic polymer.

The compensation film 1360 is deposited to a thickness that is the same or greater than the thickness difference between the chips 850 and 1250 when the chip 1250 is thinner than the chip 850. The compensation film 1360 can have a thickness in a range of 10 nm to 400 microns. The compensation film 1360 can be thicker than the range above; however, increasing the thickness may complicate processing. After reading this specification, skilled artisans will be able to determine a thickness for the compensation film 1360 that meets the needs or desires for a particular application.

In the embodiment as illustrated in FIG. 13, the compensation film 1360 is not deposited over all exposed surfaces of the destination substrate 222. The portion of the destination substrate 222 to the left of the chip 850 does not have the compensation film 1360. In another embodiment, the compensation film 1360 can be dispensed over all of the exposed surface of the destination substrate 222. The compensation film 1360 is dispensed over targeted area and other areas of the destination substrate 222 outside the targeted area.

Figure 14:
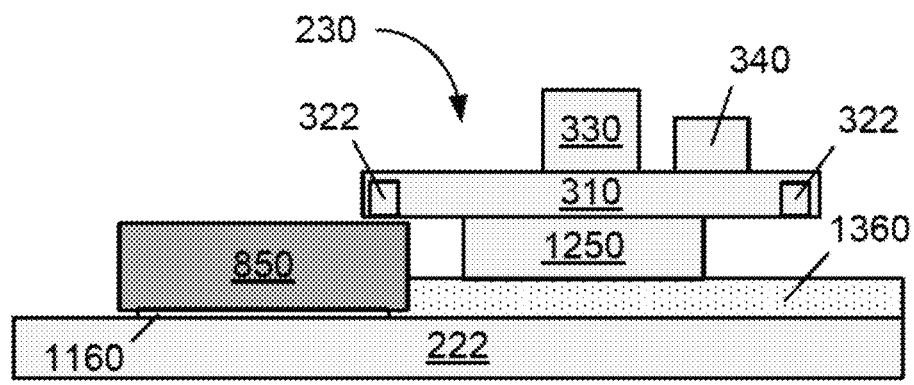
FIG. 14 includes an illustration of a cross-sectional view of the chip transfer module, the other chip, the compensation film, and the destination substrate after the other chip is positioned over a targeted location of the destination substrate.

The process can further include positioning the other chip with respect to the destination substrate at block 642 in FIG. 6. The chip chuck 310, the destination substrate 222, or both can be moved so that the chip 1250 contacts the compensation film 1360 as illustrated in FIG. 14. The positioning system 330 can be used to position the chip 1250. The thickness of the chip 1250, the thickness of the chip 850, or the thickness difference between the chips 850 and 1250 may or may not be used when positioning the chip 1250. When the thickness of the chip 1250, the chip 850, or the thickness difference is used, such thickness or thickness difference may be used for coarse positioning of the chip 1250. During positioning, the chip 1250 contacts the compensation film 1360.

In addition to or in place of thicknesses or thickness difference, distances as measured by one or more of the gap sensors 322, an elevation of the distal surface of the chip 850 or substrate chuck 220, alignment marks (not illustrated) on the destination substrate 222, or any combination thereof may be used in positioning the chip 1250 over the targeted location of the destination substrate 222.

When the thickness difference is used, the thickness difference may or may not be used for coarse positioning of the chip 1250. One or more gap sensors 322 can be used during the fine positioning of the chip 1250. The gap sensor 322 can measure the distance between sensor surface and the distal surface of the chip 850. The controller 240 (FIG. 2) may or may not have information or access to information that correlates the elevations of the sensor surfaces 324 and the chucking plane. The distance information can be used when controlling the position of the chip 1250 with the positioning system 330. Thus, the distal surface for the chip 1250 may be co-planar with the distal surface of the chip 850. In another embodiment, the average elevation along the distal surface of the chip 1250 may be within a desired elevational difference of the average elevation along the distal surface of the chip 850. The elevational difference can be at most 9 microns, at most 3 microns, or at most 0.9 micron.

After the chip 1250 contacts the compensation film 1360 over the targeted location of the destination substrate 222, the chip retention actuator 340 can be deactivated to release the chip 1250. The chip transfer module 230 can be moved away from the chip 1250. Alternatively, the chip transfer module 230 may hold the chip 1250 until the compensation film 1360 changes state as described below.

Figure 15:
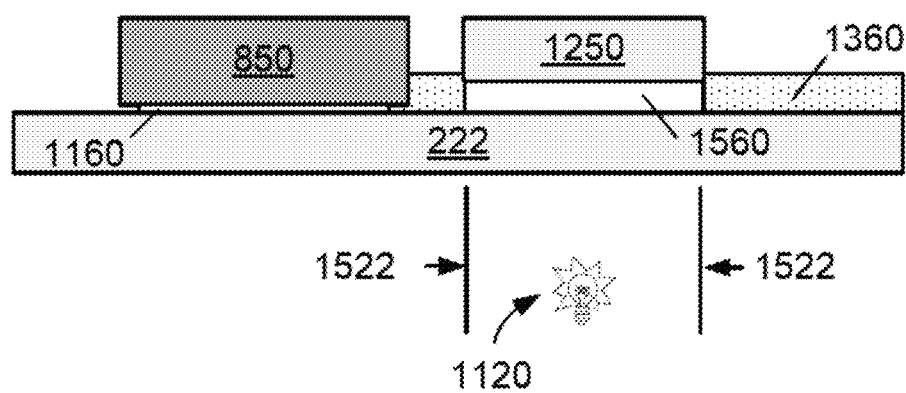
FIG. 15 includes an illustration of a cross-sectional view of the chips, the compensation film, and the destination substrate after at least a portion of the compensation film changed state.

The process further includes changing a state of the compensation film corresponding to the targeted location at block 644 of FIG. 6. Changing the state can include any of the changes previously described with respect to the bonding film 960 changing state to the bonding film 1160. Changing the state of the compensation film 1360 can be the same or different from changing the state of the bonding film 960. Referring to FIG. 15, the radiation source 1120 emits radiation that is transmitted to change the compensation film 1360 in one state to a compensation film 1560 in another state. The radiation from the radiation source 1120 may be restricted by a collimator 1522 or a mask (not illustrated) or the radiation source 1120 may emit a radiation over a relatively small area. Alternatively, the radiation may be a flood exposure where radiation reaches all or nearly all of the destination substrate 222. In the embodiment as illustrated, the material of the destination substrate 222 allows radiation to pass through the destination substrate 222 to reach the compensation film 1360. In an embodiment, the compensation film 1360 can include a precursor of a polymer and the compensation film 1560 can be the corresponding polymer. For example, the polymer can be an acrylate.

The compensation film 1560 may extend to the edges of the chip 1250 or extend under only part or all of the chip 1250. The area of the compensation film 1560 in contact with the destination substrate 222 and the chip 1250 is sufficient to retain the chip 1250 until a subsequent transfer operation is performed. The remaining portion of the compensation film 1360 (not exposed to radiation) may or may not be removed at this time. The compensation film 1560 remains disposed between the chip 1250 and the destination substrate 222.

At this point in the process, the chips 850 and 1250 are attached to the destination substrate 222. The chips 850 and 1250 can be transferred from the destination substrate 222 to another substrate. FIG. 7 includes a portion of the flow diagram with respect to transferring the chips 850 and 1250 from the destination substrate 222 to the other substrate.

Figure 16:
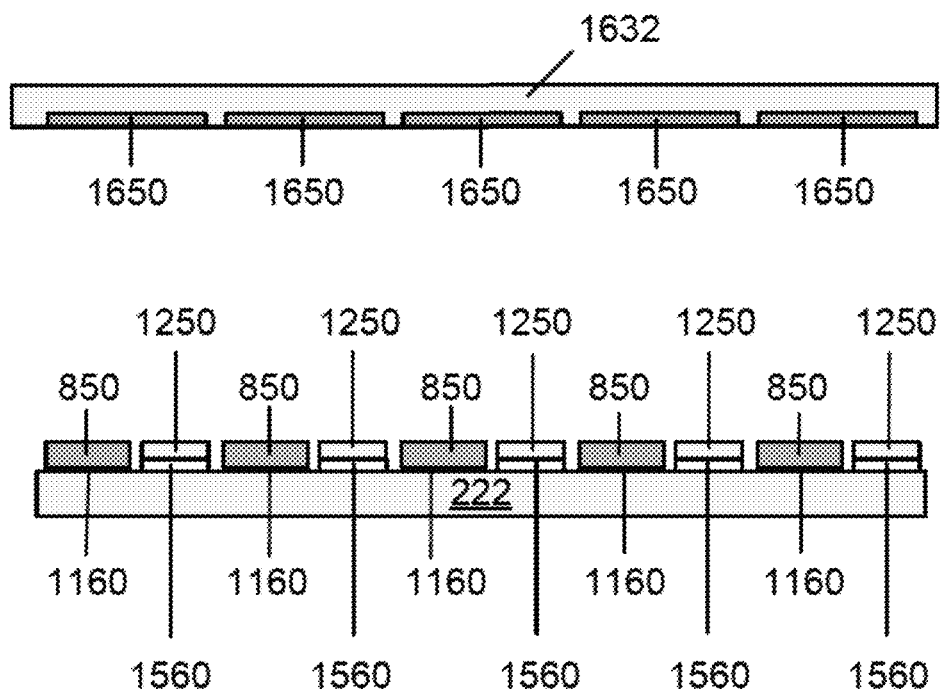
FIG. 16 includes an illustration of a cross-sectional view of the destination substrate, the chips, the films, and another substrate that includes sets of circuit elements.

The process includes holding another substrate on a substrate chuck at block 722. FIG. 16 includes a cross-sectional view of the destination substrate 222 and its corresponding chips 850 and 1250 and compensation films 1360 and 1560. FIG. 16 also includes a substrate 1632 that is held by a substrate chuck that can be coupled to a chuck stage used in positioning the substrate chuck. The substrate 1632 has been registered in its respective stage coordinates. The substrate chuck and chuck stage are not illustrated in FIG. 16. The substrate 1632 can be a final substrate or another intermediate substrate. For example, the substrate 1632 may be in the form of a wafer, and the wafer can be singulated into dies. The dies may be subsequently attached to a packaging substrate, a printed wiring board, a circuit board, or another substrate.

The substrate 1632 includes sets of circuit elements 1650. The circuit elements 1650 can include wirings, traces, a redistribution layer, circuit elements (additional chips, etc.), or a combination thereof. In an embodiment, each set of circuit elements 1650 can correspond to a device, such a microprocessor, a microcontroller, a graphic processing unit, a digital signal processor, a memory chip (for example, a Level 2 or Level 3 cache, a flash memory, or the like), a power transistor chip, a power circuit chip, or the like. The device corresponding to the sets of the circuit elements 1650 can be a different type of device as compared to the chips 850 and 1250. In a non-limiting example, the sets of the circuit elements 1650 can be microprocessors, the chip 850 can be a graphic processing unit, and chip 1250 can be a Level 2 or Level 3 cache. Many other combinations are possible.

The process can also include positioning the destination substrate and the other substrate relative to each other at block 724 in FIG. 7. Referring to FIG. 16, the positioning can include moving the destination substrate 222 closer to the other substrate 1632, moving the other substrate 1632 closer to the destination substrate 222, or moving both the destination substrate 222 and the other substrate 1632 closer to each other. The substrates 222 and 1632 can be registered so that they are in the proper position to allow for the chips 850 and 1250 to make an electrical connection with the sets of circuit elements 1650.

The process can include attaching the chips to the sets of circuit elements within the other substrate at block 732 in FIG. 7. The placement of chips 850 and 1250 on the destination substrate 222 using the techniques as described herein are well suited in applications where precise control is needed or desired when transferring chips between substrates. The distal surfaces of the chips 850 and 1250 can be co-planar or closer to being co-planar as compared to a conventional technology.

In an embodiment, hybrid bonding can be used in 3D packaging technologies. The chips 850 and 1250 and the sets of circuit elements 1650 can have an insulator, such as an oxide, and a conductive metal, such as Al, Cu, Ni, or the like, along their exposed surfaces. The chips 850 and 1250 and the sets of circuit elements 1650 may have been formed using a damascene process. The exposed surfaces can be activated with a plasma, and the activated exposed surfaces of the chips 850 and 1250 can be brought in contact with the activated exposed surfaces of the sets of circuit elements 1650. The bonding film 1160 and the compensation film 1560 may be formulated to be stable when the exposed surfaces are activated with a plasma.

Pressure is exerted to bond the chips 850 and 1250 to the sets of circuit elements 1650 to cause the insulators to bond to each other. In an embodiment, the bonds can be oxide-to-oxide bonds. The bonding pressure can be in a range 0.5 N/cm$^2$ to 20 N/cm$^2$. The bonding can be performed at room temperature (for example, at a temperature in a range from 20° C. to 25° C.) or higher. Bonding can be preformed at a temperature less than a subsequent anneal to expand the conductive metal. The temperature and pressure may be limited depending on the composition of the bonding film 1160 and the compensation film 1560, if such films are present during bonding. For example, the temperature may be no higher than approximately 200° C. After reading this specification, skilled artisans will be able to determine the pressure and temperature used for bonding. External pressure may or may not be present after bonding, itself, is completed.

Figure 17:
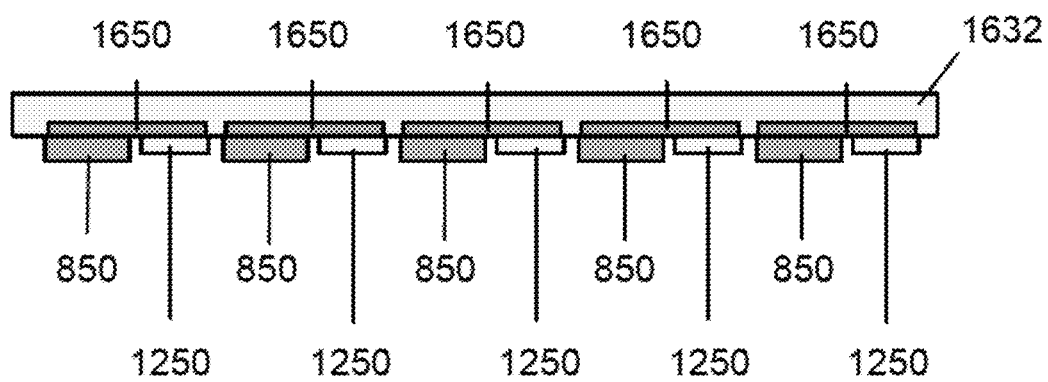
FIG. 17 includes an illustration of a cross-sectional view of the other substrate and sets of circuit elements after the chips from the destination substrate are physically and electrically coupled to the sets of circuit elements.

The process can further include removing the destination substrate, the bonding film, and the compensation film from the chips at block 742 in FIG. 7. The destination substrate 222 the bonding film 1160, and the compensation film 1560 can be removed from the chips 850 and 1250 after bonding is completed. FIG. 17 includes a cross-sectional view of the workpiece at this point in the process.

After bonding, the chips 850 and 1250 and the sets of circuit elements 1650 can be annealed at a temperature in a range from 180° C. to 400° C. In an embodiment, annealing may be performed at one or more temperatures. As the temperature of the conductive metal increases, the conductive metal expends. The conductive metal in the sets of circuit elements 1650 contacts the conductive metal in the chips 850 and 1250 to make a physical and electrical coupling between the conductive materials. If needed or desired, the anneal temperature can be increased further, so that atoms from the conductive metals can cross the interfaces between the circuit elements 1650 and the chips 850 and 1250 and reduce contact resistance. In an embodiment, the physical and electrical coupling can be a physical and electrical connection. Thus, the chips 850 and 1250 and the sets of circuit elements 1650 can communicate with each other.

The process as illustrated in the flow chart in FIG. 7 and described above is not limited to hybrid bonding. A flip-chip process may be used. Solder balls or microbumps may be formed along the distal surfaces of the chips 850 and 1250 or along the exposed surface of the sets of circuit elements 1650. The solder balls or microbumps can include an alloy that includes In, Sn or Pb, such as Ag—Sn, Ag—Cu—Sn, Pb—Sn, Bi—Sn, Bi—Pb, In—Pb, or In—Ag. The process described with respect to the blocks 722 and 724 in FIG. 7 can be performed.

Attaching the chips 850 and 1250 to the sets of circuit elements 1650 can be achieved by annealing the chips 850 and 1250 and the sets of circuit elements 1650 at a temperature that is at least the melting point or flow point of the solder balls or microbumps. Similar to a prior embodiment, the composition of the bonding film 1160 and the compensation film 1560 may provide an upper limit on temperature of the anneal. The solder balls or microbumps flow and form a physical and electrical contact between conductors within the chips 850 and 1250 and conductors along the lower surface of the sets of circuit elements 1650. After cooling, the material within the alloy solidifies. The destination substrate 222 and the bonding film 1160 and the compensation film 1560 can be removed from the chips 850 and 1250 if they have not already been removed.

The substrate 1632 with the attached chips 850 and 1250 can be further processed. For example, the other substrate 1632 or any of the chips 850 and 1250 can include thru-substrate vias and allow other chips to be attached along the upper surface of the substrate 1632 or the proximal surface of a chip 850 or 1250. In the same or different embodiment, the other substrate 1632 can be singulated by cutting the substrate 1632 between the sets of circuit elements 1650. Other processing may be performed. After reading this specification, skilled artisans will be able to process the workpiece as illustrated in FIG. 17 for a particular application.

A previous embodiment as illustrated in the figures and described in the corresponding text addressed embodiments where a bonding film was used. Other processes may be used. For example, the bonding film 960 may be replaced by an adhesive film or tape that is placed on the destination substrate 222. Referring to the process flow in FIGS. 5 and 6, the operations in block 534 would be replaced by placing an adhesive film or tape along the surface of the destination substrate. An example of such a tape can be a double-sided acrylic tape (such as optically clear laminating adhesive 8146-2 from 3M made by St. Paul, MN, US). If ultraviolet light does not need to pass through the tape, the tape can include polyimide, such as Kapton®-brand tape made by DuPont de Nemours, Inc. of Wilmington, DE, US. The chip 850 can be positioned using an embodiment previously described with respect to FIGS. 8 to 10. The adhesive material within the adhesive film or tape keeps the chip 850 in place. The changing-state operation in block 544 in FIG. 5 is not performed. The operations in blocks 622 to 644 in FIG. 6 are performed. The compensation film 1360 is deposited onto the adhesive film or tape rather than directly onto the destination substrate 222. Subsequent processing is performed as illustrated in FIGS. 13 to 15 and the corresponding description.

Figure 18:
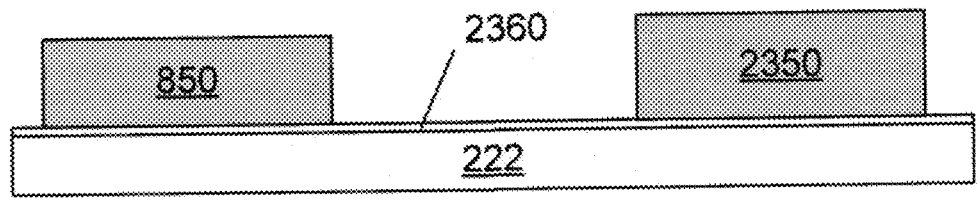
FIG. 18 includes an illustration of a cross-sectional view of the destination substrate, an adhesive tape, and chips, where distal surfaces of the chips are at different elevations above the destination substrate.

In a further implementation, the chip transfer module 230 including the chip chuck 310 can be used when previously mounted chips do not have distal surfaces lying along the same plane. FIG. 18 includes a cross-sectional view of a workpiece including the destination substrate 222, chips 850 and 2350, and an adhesive tape 2360. The adhesive tape 2360 is applied to the surface of the destination substrate 222. An example of such a tape that can be used is a double-sided acrylic tape. If ultraviolet light does not need to pass through the tape, the tape can include polyimide, such as Kapton®-brand tape made by DuPont de Nemours, Inc. of Wilmington, DE, US.

The chips 850 and 2350 may have identical electrical circuits and perform identical functions. The chip 850 may have been formed from a wafer, and the chip 2350 may have been formed for a different wafer. The wafers may have different thicknesses. For example, the wafer for the chip 850 can be a 200 mm wafer, and the other wafer for the chip 2350 can be a 300 mm wafer. Alternatively, the wafers may have had the same original thickness; however, the wafers may have been thinned using different equipment or different processing techniques. Alternatively, the chips 850 and 2350 may have different electrical circuits. The thicknesses the chips 850 and 2350 may be significantly different from each other.

The chip 2350 has a proximal surface and a distal surface opposite the proximal surface, where the adhesive tape 2360 is closer to the proximal surface than to the distal surface. The chip 2350 has a device side and a back side. In the embodiment as illustrated, the device side is along the distal surface of the chip 2350, and the back side is along the proximal surface of the chip 2350. In another embodiment, the device side is along the proximal surface of the chip 2350, and the back side is along the distal surface of the chip 2350.

The chip 850 can be positioned using an embodiment previously described with respect to FIGS. 8 and 10. Thus, the process operations in blocks 522, 524, 532, and 542 in FIG. 5 have been performed. After the chip 850 is in its proper position, the chip retention actuator 340 (seen in FIG. 3) can be deactivated, and the chip transfer module 230 moves to a source substrate that has the chip 2350. The process operations in blocks 522, 524, 532, and 542 in FIG. 5 are repeated for chip 2350.

The process operations in blocks 534 and 544 are not performed in this embodiment. However, in a different embodiment, the adhesive tape 2360 could be replaced by the bonding film 960 (block 534 in FIG. 5 and illustrated in FIG. 9). The chips 850 and 2350 contact the bonding film 960 when the chips 850 and 2350 are properly positioned with respect to the destination substrate 222. The bonding film 960 can change state to become the bonding film 1160 (block 544 in FIG. 5 and illustrated in FIG. 11). The workpiece illustrated in FIG. 11 will have the chip 2350 (in FIG. 18 but not illustrated in FIG. 11). The bonding film 960 can be selectively irradiated, similar to what is illustrated in FIG. 11 however, the portion of bonding film 960 that was under the chip 2350 would also have changed state to the bonding film 1160. The radiation source 1120 can selectively irradiate the compensation film, similar to what is illustrated in FIG. 11, or a flood exposure can be used where substantially all of the destination substrate 222 is irradiated by the radiation source 1120 (no collimator 1122 or a mask). Unexposed portions of the bonding film 960, if any, may or may not be removed.

The process further includes selecting another chip from another source substrate at block 622 in FIG. 6. FIG. 12 includes a cross-sectional view of the chip transfer module 230, the source substrate 1212, and the chip 1250. The chip 1250 can be of any of the types previously described with respect to the chip 850. The chip 1250 can be of the same type or a different type as compared to the chip 850 or the chip 2350 (FIG. 18). The chip 1250 may have the same circuits or different circuits as compared to the chip 850 or the chip 2350. In the embodiment illustrated in FIG. 12, the device side is along distal surface of the chip 1250, and in another embodiment, the device side of the chip 1250 is along the proximal surface of the chip 1250.

The process can further include holding the other chip using the chip chuck at block 624 in FIG. 6. Referring to FIG. 12, the positioning system 330 causes the chip chuck 310 to contact the chip 1250, and the chip retention actuator 340 is activated. The chip transfer module 230 provides sufficient force to remove the chip 1250 from the source substrate 1212. The chip 1250 is no longer in contact with the source substrate 1212 and able to be moved to a location spaced apart from the source substrate 1212.

Figure 19:
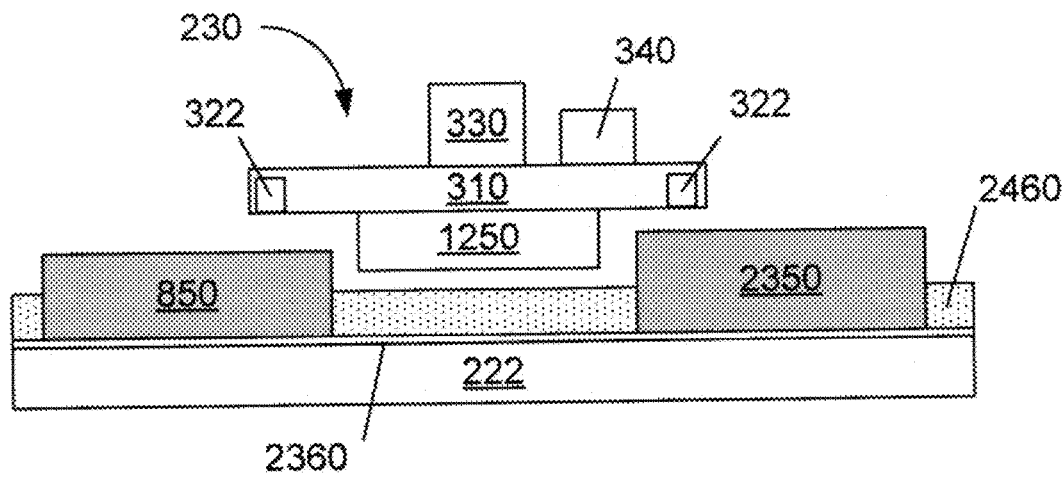
FIG. 19 includes an illustration of a cross-sectional view of the chip transfer module and a chip being held by a chip chuck, the destination substrate, an adhesive tape, the chips, and a compensation film as the chip held by the chip chuck is being positioned within a gap between the chips coupled to the adhesive tape.

The process can include forming a compensation film onto the destination substrate at a targeted location at block 634 in FIG. 6. The compensation film 2460 is formed over all exposed surfaces of the adhesive tape 2360 as illustrated in FIG. 19. The compensation film 2460 can include any of the materials and be formed using any of the techniques as previously described with respect to the compensation film 1360 (FIG. 13). In another embodiment, the compensation film 2460 may be selectively deposited onto an exposed portion of the adhesive tape 2360. The thickness of the compensation film 2460 can be at least the difference in thickness between the chip 1250 and the thicker of chips 850 and 2350. The compensation film 2460 can have a thickness in a range of 10 nm to 400 microns. The compensation film 2460 can be thicker than the range above; however, increasing the thickness may complicate processing. After reading this specification, skilled artisans will be able to determine a thickness for the compensation film 2460 that meets the needs or desires for a particular application.

The process can further include positioning the other chip with respect to the destination substrate at block 642 in FIG. 6. The chip chuck 310, the substrate 222, or both can be moved so that the chip 2350 is near the compensation film 2460 as illustrated in FIG. 19. The positioning system 330 can be used to position the chip 1250. The thickness of the chip 1250, the thickness of the chip 850 or the chip 2350, or the thickness difference between the chip 1250 and the chip 850 or 2350 may or may not be used when positioning the chip 1250. When the thickness of the chip 1250, the chip 850, the chip 2350, or the thickness difference is used, such thickness or thickness difference may be used for coarse positioning of the chip 2350.

Figure 20:
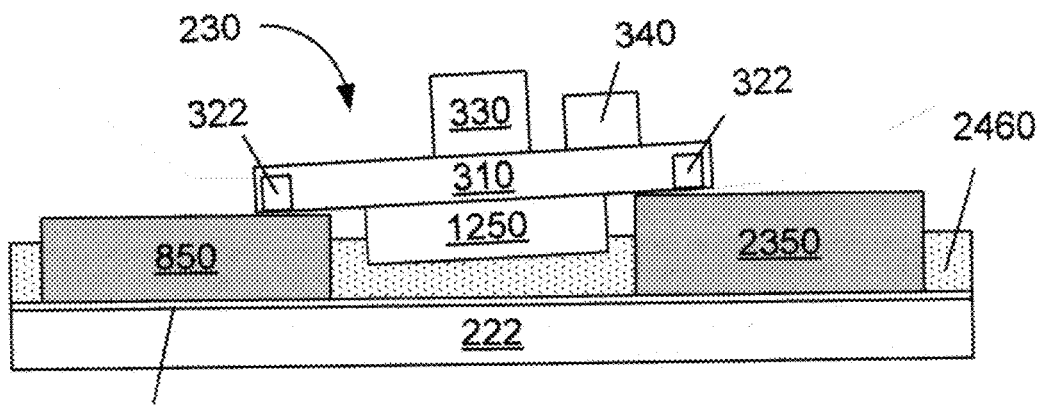
FIG. 20 includes an illustration of a cross-sectional view of the chip transfer module and a chip being held by a chip chuck, the destination substrate, an adhesive tape, the chips, and a compensation film after the chip chuck contacts the chips coupled to the adhesive tape.

As the chip chuck 310 moves closer to the destination substrate 222, the chip chuck 310 contacts the chip 2350 before the chip chuck 310 contacts the chip 850. After the chip chuck 310 continues to move toward the destination substrate 222, the chip chuck 310 contacts the chip 850 as illustrated in FIG. 20. During positioning, the chip 1250 contacts the compensation film 2460 and displaces some of the compensation film 2460 causing the thickness of the compensation film 2460 to increase in areas outside where the chip 1250 makes contact with the compensation film 2460. The positioning can be terminated after the chip chuck 310 contacts the chips 850 and 2350. The chip 1250 is in the gap between the chips 850 and 2350 and overlies the targeted location of the destination substrate 222.

Endpoint detection for positioning the chip 1250 may be used at least in part to determine when the vertical portion of positioning for the chip 1250 is terminated. The vertical portion of positioning is in a direction substantially perpendicular to a plane defined by the upper surface of the destination substrate 222. The chip transfer module 230 can include pressure sensors (not illustrated) within the chip chuck 310. The vertical portion of position may be terminated when the pressure sensors are activated, indicating that the chip chuck 310 contacts both chips 850 and 2350.

Figure 21:
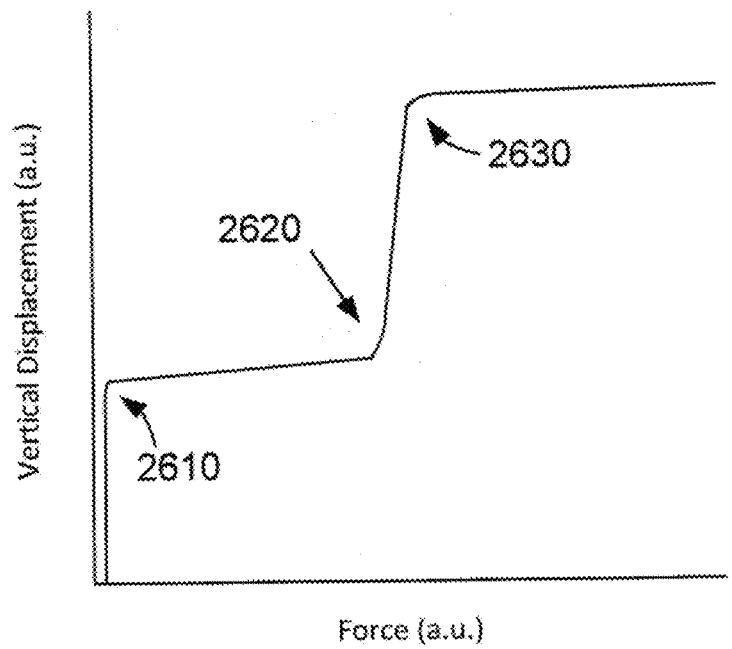
FIG. 21 includes a plot of force as a function of vertical displacement while the chip is being positioned.

In another embodiment, force may be monitored to determine when the chip chuck 310 contacts the chips 850 and 2350. FIG. 21 includes a plot of displacement as a function of force, both of which are in arbitrary units (a.u.). For vertical displacement, a value of 0 corresponds to the chip chuck 310 before the chip chuck 310 is lowered toward the destination substrate 222. Thus, as the value of displacement increases, the chip chuck 310 is moving in a vertical direction toward the destination substrate 222. Force can be correlated to downforce pressure, current supplied to a motor with the chip positioning system 330, or the like. In FIG. 21, relatively little force is needed to displace the chip chuck 310 in a vertical direction before the chip chuck 310 contacts either of the chips 850 and 2350. The chip chuck 310 reaches the chip 2350, and the force needed for vertical displacement significantly increases. The transition point 2610 in FIG. 21 corresponds to contact between the chip chuck 310 and the chip 2350 and the corresponding increase in force.

The transition point 2620 corresponds to where the rate of increase in force applied for further vertical displacement decreases. Between transition points 2620 and 2630, the amount of force applied may be substantially constant or increase at a significantly slower rate than between the transition points 2610 and 2620. The portion of the curve between the transition points 2620 and 2630 corresponds to motion of the chip chuck 310 after the chip chuck 310 contacts the chip 2350 and before the chip chuck 310 contacts the chip 850. The transition point 2630 corresponds to the chip chuck 310 contacting the chip 850. A further increase in force has a very small or no change in vertical displacement. Referring to FIG. 21, endpoint detection can be based on the second significant increase in force with no or little displacement, which corresponds to the transition 2630.

Alternatively, endpoint detection may be based on an angular displacement of the chip chuck 310. An angular displacement value of 0 corresponds to the chucking surface 312 (FIG. 3) of the chip chuck 310 being parallel to the surface of the destination substrate 222. After the chip chuck 310 contacts the chip 2350 and before reaching the chip 850, the chip chuck 310 rotates in a counterclockwise direction and the value of the angular displacement is no longer 0. The value of the angular displacement gets further from 0 until the chip 850 is contacted. After the chip chuck 310 contacts the chips 850 and 2350, the value of angular displacement does not significantly change. Thus, endpoint detection can be based on a non-zero value and the rate of change of angular displacement is at or very close to zero.

Figure 22:
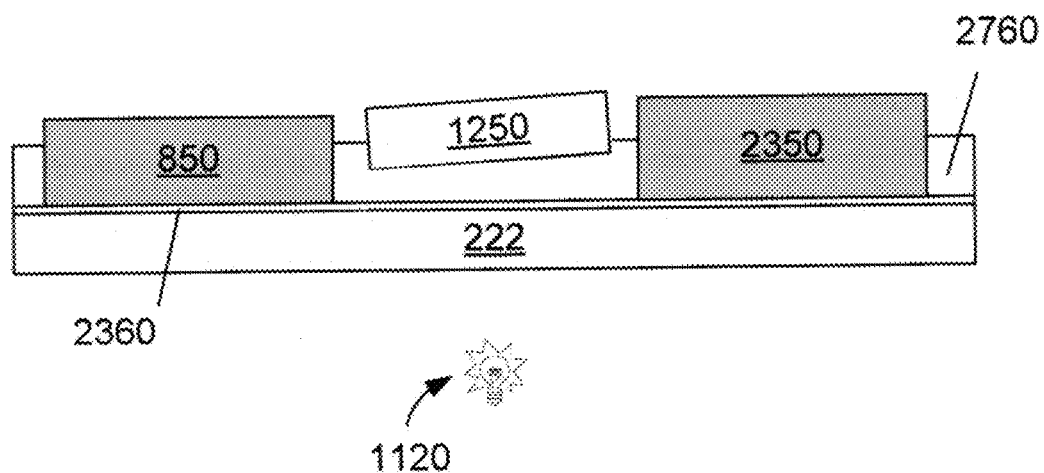
FIG. 22 includes an illustration of a cross-sectional view of the destination substrate, the adhesive tape, the chips, and the compensation film after the compensation film changed state.

The process includes changing a state of the compensation film corresponding to the targeted location at block 644 in FIG. 6. FIG. 22 includes a cross-sectional view of a workpiece that includes the destination substrate 222, the adhesive tape 2360, the chips 850 and 2350, a compensation film 2760, and the radiation source 1120. Any of the techniques previously described with respect to the change of state corresponding to the compensation films 1360 (FIG. 13) and 1560 (FIG. 15) can be performed for the change of state corresponding to the films 2460 (FIG. 19) and the compensation film 2760. In the embodiment illustrated in FIG. 22, the radiation source 1120 irradiates substantially all of the destination substrate 222 with actinic radiation for the compensation film 2460 to cause substantially all of the compensation film 2460 to become the compensation film 2760. In another embodiment, the destination substrate 222 may be selectively irradiated.

The chip 1250 may or may not be retained by the chip chuck 310 during the change of state. The chip retention actuator 340 can be deactivated, and the chip transfer module 230 can be moved away from the chip 1250, if this has not yet already occurred.

The process can continue with the blocks 722, 724, 732, and 742 in FIG. 7 and illustrated in FIGS. 16 and 17 and the corresponding text. In FIGS. 16 and 17, some of the chips 850 are replaced with the chips 2350. In the same or different embodiment, at least one of the sets of circuit elements 1650 may be coupled to the chips 850, 1250, and 2350.

In any of the prior implementations, the device sides and the back sides of the chips can be reversed. The device sides of the chips 850, 1250, and 2350 (if the chip 2350 is present) are along the proximal surfaces of the chips 850, 1250, and 2350, and the back sides of the chips 850, 1250, and 2350 are along the distal surfaces of the chips 850, 1250, and 2350. The sets of circuit elements 1650 can be physically and electrically connected to part or all of the back side of the chips 850, 1250, and 2350. The sets of circuit elements

1650 may provide a substantially constant volage, such as ground, a relatively negative power supply voltage (for example, a source voltage, Vs, or an emitter voltage, Ve), a relatively positive power supply voltage (for example, a drain voltage, Vd, or a collector voltage, Vc), an intermediate voltage (for example, $$\frac{Vs + Vd}{2} \text{ or } \frac{Ve + Vc}{2}),$$

or the like to the back sides of the chips 850, 1250, and 2350. If needed or desired, the other substrate 1632 may include an electrically insulating and thermally conductive material, such as AN, to help dissipate heat when any one of the chips 850, 1250, and 2350 or a combination of chips 850, 1250, and 2350 are operating. In a further embodiment, the sets of circuit elements 1650 may be removed, and the other substrate 1632 can include an electrically conductive material, such as an elemental metal or a metal alloy.

Embodiments described herein can help to reduce damage to chips, sets of circuit elements, and substrates as the chips that are temporarily coupled from the destination substrate to transfer to another substrate. A chip chuck can hold a chip and include one or more gap sensors that can measure the distance to a distal surface of another chip already coupled to a destination substrate. The chip being held by the chip chuck can be positioned so that the distal surfaces of the chips are co-planar or that the difference in average elevations along the distal surfaces of the chips are within a desired amount. In an implementation, a compensation film can help to retain temporarily one or both chips in their respective positions before the chips are transferred to another substrate. The co-planarity or relatively small elevational difference of the distal surfaces of the chips is well suited for hybrid bonding and flip chip bonding.

In an implementation, two chips coupled to a substrate can be separated by a gap. The chips may have distal surfaces that lie at different elevations above a destination substrate. Another chip can be placed within the gap and positioned so that its distal surface provides a more gradual transition in elevation between the distal surfaces of the chips along opposite sides of the gap. In this implementation, the chip chuck can contact the chips along opposite sides of the gaps. The placement of the chips over the destination substrate allows for a more gradual change in elevation along the distal surfaces of the chips.

After the chips are mounted onto the destination substrate, the chips can be transferred to another substrate with less risk of damages. After reading this specification, skilled artisans will appreciate that many implementations are described, and an implementation can be tailored for a particular application.

In an alternative embodiment, the apparatus 200 includes multiple (for example, 2, 6, 10, 100, up to the number of chip sites on a substrate) chip transfer modules 240 that are used in parallel to pick up multiple chips from the source substrate 212, then position those multiple chips onto a destination substrate 222. In an alternative embodiment, the positioning systems 330 and chip retention actuators 340 of each chip transfer modules 240 are independent and operate in a coordinated manner when picking up multiple chips from the source substrate 212 and placing multiple chips onto the destination substrate 222. In an alternative embodiment, some of the components of the positioning systems 330 and chip retention actuators are shared among the multiple chip transfer modules.

Note that not all of the activities described above in the general description or the examples are required, that a portion of a specific activity may not be required, and that one or more further activities can be performed in addition to those described. Still further, the order in which activities are listed is not necessarily the order in which they are performed.

Benefits, other advantages, and solutions to problems have been described above with regard to specific implementations. However, the benefits, advantages, solutions to problems, and any feature(s) that can cause any benefit, advantage, or solution to occur or become more pronounced are not to be construed as a critical, required, or essential feature of any or all the claims.

The specification and illustrations of the implementations described herein are intended to provide a general understanding of the structure of the various implementations. The specification and illustrations are not intended to serve as an exhaustive and comprehensive description of all of the elements and features of apparatus and systems that use the structures or methods described herein. Separate implementations can also be provided in combination in a single implementation, and conversely, various features that are, for brevity, described in the context of a single implementation, can also be provided separately or in any subcombination. Further, reference to values stated in ranges includes each and every value within that range. Many other implementations can be apparent to skilled artisans only after reading this specification. Other implementations can be used and derived from the disclosure, such that a structural substitution, logical substitution, or another change can be made without departing from the scope of the disclosure. Accordingly, the disclosure is to be regarded as illustrative rather than restrictive.

What is claimed is:

1. A method, comprising:
   holding a first chip using a chip chuck, wherein the chip chuck comprises:
      a chucking surface configured to hold the first chip; and
      a first gap sensor;
   holding a substrate on a substrate chuck, wherein a second chip is coupled to the substrate and has a proximal surface and a distal surface opposite the proximal surface, and the substrate is closer to the proximal surface of the second chip than to the distal surface of the second chip;
   measuring a distance between the first gap sensor and the distal surface of the second chip; and
   controlling a position of the first chip relative to the substrate using the distance between the first gap sensor and the distal surface of the second chip.

2. The method of claim 1, wherein measuring the distance comprises measuring a force supplied by an actuator that changes a distance between the chucking surface of the chip chuck and the distal surface of the second chip.

3. The method of claim 1, wherein:
   the method further comprises depositing a compensation film onto the substrate at a targeted location before decreasing a distance between the first chip and the substrate;
   during controlling the position of the first chip, a surface of the first chip contacts a portion of the compensation film that is disposed between the first chip and the targeted location of the substrate; and the method further comprises changing a state of the portion of the compensation film that is disposed between the substrate and the first chip.

4. The method of claim 3, further comprising:
depositing a bonding film onto the substrate at a desired location;
bringing the second chip in contact with the bonding film, such that a portion of the bonding film is disposed between the second chip and the desired location of the substrate; and
changing a state of the portion of the bonding film that is disposed between the substrate and the second chip.

5. The method of claim 4, wherein depositing a bonding film, bringing the second chip in contact with the bonding film, and changing the state of the portion bonding film are performed before the first chip contacts the portion of the compensation film.

6. The method of claim 4, wherein changing the state of the portion of the bonding film is performed by selectively curing the bonding film.

7. The method of claim 6, wherein the compensation film and the bonding film have a same composition.

8. The method of claim 3, further comprising:
bonding the first chip and the second chip to a destination substrate;
removing the substrate from the first chip and the second chip;
removing the compensation film from the first chip; and
annealing the destination substrate, the first chip, and the second chip after removing the substrate and removing the compensation film.

9. The method of claim 3, wherein:
the first chip has a device side and a back side opposite the device side, wherein a majority of circuit elements within the first chip are along the device side, and
the device side of the first chip contacts the chip chuck during a portion of the method.

10. The method of claim 3, wherein:
the first chip has a device side and a back side opposite the device side, wherein a majority of circuit elements within the first chip are along the device side, and
the back side of the second chip contacts the chip chuck during a portion of the method.

11. The method of claim 1, wherein:
a third chip is coupled to the substrate and has a proximal surface and a distal surface opposite the proximal surface, and the substrate is closer to the proximal surface of the third chip than to the distal surface of the third chip,
an average elevation of the distal surface of the second chip lies at a different elevation as compared to an average elevation of the distal surface of the third chip,
a gap is disposed between the second chip and the third chip, and
controlling the position of the first chip further comprises:
placing the first chip within the gap between the second chip and the third chip; and
terminating movement of the first chip after the chip chuck is within a predetermined distance between the chip chuck and each of the second chip and the third chip.

12. The method of claim 11, further comprising:
depositing a compensation film onto the substrate before controlling the position of the first chip;
during controlling the position of the first chip, a surface of the first chip contacts a portion of the compensation film; and
changing a state of the portion of the compensation film that is disposed between the substrate and the first chip.

13. The method of claim 11, wherein the predetermined distance is 0 nm.

* * * * *